US008633094B2

(12) United States Patent
Ramdani et al.

(10) Patent No.: US 8,633,094 B2
(45) Date of Patent: Jan. 21, 2014

(54) GAN HIGH VOLTAGE HFET WITH PASSIVATION PLUS GATE DIELECTRIC MULTILAYER STRUCTURE

(75) Inventors: Jamal Ramdani, Raritan, NJ (US); Linlin Liu, Hillsborough, NJ (US); John Paul Edwards, Hillsborough, NJ (US)

(73) Assignee: Power Integrations, Inc., San Jose, CA (US)

( * ) Notice: Subject to any disclaimer, the term of this patent is extended or adjusted under 35 U.S.C. 154(b) by 140 days.

(21) Appl. No.: 13/373,811

(22) Filed: Dec. 1, 2011

(65) Prior Publication Data

US 2013/0140605 A1     Jun. 6, 2013

(51) Int. Cl.
*H01L 29/778* (2006.01)

(52) U.S. Cl.
USPC ............... 438/485; 257/192; 257/E29.246; 257/E21.407

(58) Field of Classification Search
CPC ................ H01L 21/02252; H01L 21/02274; H01L 21/02315; H01L 21/0234; H01L 29/66431; H01L 29/66462; H01L 29/778; H01L 2924/13064
USPC ............. 257/194, E29.09, E29.246, E21.143, 257/E21.403, E21.407; 438/478, 485, 513, 438/798
See application file for complete search history.

(56) References Cited

U.S. PATENT DOCUMENTS

| 3,775,200 A | 1/1973 | De Nobel et al. |
| 4,233,617 A | 11/1980 | Klaassen et al. |
| 4,543,595 A | 9/1985 | Vora |
| 4,745,445 A | 5/1988 | Mun et al. |
| 4,946,547 A | 8/1990 | Palmour et al. |
| 4,967,243 A | 10/1990 | Baliga et al. |
| 5,200,022 A | 4/1993 | Kong et al. |
| 5,602,418 A | 2/1997 | Imai et al. |
| 5,612,567 A | 3/1997 | Baliga |
| 5,686,738 A | 11/1997 | Moustakas |
| 5,689,128 A | 11/1997 | Hshieh et al. |

(Continued)

FOREIGN PATENT DOCUMENTS

| CN | 101689561 | 3/2010 |
| EP | 0081414 | 6/1983 |

(Continued)

OTHER PUBLICATIONS

Arulkumaran et al. "Studies on the Influences of I-GaN, N-GaN, P-GaN and InGaN Cap Layers in AlGaN/GaN High-Electron-Mobility Transistors," Japanese Journal of Applied Physics, Japan Society of Applied Physics, JP, vol. 44, No. 5A, May 10, 2005, pp. 2953-2960, XP001502490, ISSN: 0021-4922.

(Continued)

*Primary Examiner* — Tom Thomas
*Assistant Examiner* — Christopher M Roland
(74) *Attorney, Agent, or Firm* — The Law Offices of Bradley J. Bereznak

(57) ABSTRACT

A method of fabricating a multi-layer structure for a power transistor device includes performing, within a reaction chamber, a nitrogen plasma strike, resulting in the formation of a nitride layer directly on a nitride-based active semiconductor layer. A top surface of the nitride layer is then exposed to a second source. A subsequent nitrogen-oxygen plasma strike results in the formation of an oxy-nitride layer directly on the nitride layer. The nitride layer comprises a passivation layer and the oxy-nitride layer comprises a gate dielectric of the power transistor device.

23 Claims, 3 Drawing Sheets

(56) References Cited

U.S. PATENT DOCUMENTS

| | | | |
|---|---|---|---|
| 5,741,724 | A | 4/1998 | Ramdani et al. |
| 5,785,606 | A | 7/1998 | Marquez |
| 5,874,747 | A | 2/1999 | Redwing et al. |
| 5,877,558 | A | 3/1999 | Nakamura et al. |
| 6,051,340 | A | 4/2000 | Kawakami et al. |
| 6,121,121 | A | 9/2000 | Koide |
| 6,139,628 | A | 10/2000 | Yuri et al. |
| 6,146,457 | A | 11/2000 | Solomon |
| 6,184,570 | B1 | 2/2001 | MacDonald, Jr. et al. |
| 6,211,018 | B1 | 4/2001 | Nam et al. |
| 6,239,033 | B1 | 5/2001 | Kawai |
| 6,329,677 | B1 | 12/2001 | Oguri et al. |
| 6,331,450 | B1 | 12/2001 | Uemura |
| 6,344,665 | B1 | 2/2002 | Sung et al. |
| 6,380,108 | B1 | 4/2002 | Linthicum et al. |
| 6,389,051 | B1 | 5/2002 | Van de Walle |
| 6,432,579 | B1 | 8/2002 | Tsuji et al. |
| 6,437,374 | B1 | 8/2002 | Northrup et al. |
| 6,492,669 | B2 | 12/2002 | Nakayama et al. |
| 6,507,041 | B2 | 1/2003 | Nakamura et al. |
| 6,524,900 | B2 | 2/2003 | Dahlqvist et al. |
| 6,573,537 | B1 | 6/2003 | Steigerwald et al. |
| 6,586,777 | B1 | 7/2003 | Yuasa et al. |
| 6,586,781 | B2 | 7/2003 | Wu et al. |
| 6,593,597 | B2 | 7/2003 | Sheu |
| 6,605,854 | B2 | 8/2003 | Nagase et al. |
| 6,608,327 | B1 | 8/2003 | Davis et al. |
| 6,610,995 | B2 | 8/2003 | Nakamura et al. |
| 6,624,444 | B1 | 9/2003 | Li |
| 6,627,967 | B2 | 9/2003 | Asano et al. |
| 6,649,995 | B2 | 11/2003 | Tooi et al. |
| 6,656,823 | B2 | 12/2003 | Lee et al. |
| 6,685,804 | B1 | 2/2004 | Ikeda et al. |
| 6,768,146 | B2 | 7/2004 | Yoshida |
| 6,809,375 | B2 | 10/2004 | Takemori et al. |
| 6,855,970 | B2 | 2/2005 | Hatakeyama et al. |
| 6,949,401 | B2 | 9/2005 | Kaminski et al. |
| 6,949,774 | B2 | 9/2005 | Parikh et al. |
| 7,026,665 | B1 | 4/2006 | Smart et al. |
| 7,084,456 | B2 | 8/2006 | Williams et al. |
| 7,084,475 | B2 | 8/2006 | Shelton et al. |
| 7,109,551 | B2 | 9/2006 | Sugi et al. |
| 7,115,896 | B2 | 10/2006 | Guo et al. |
| 7,116,567 | B2 | 10/2006 | Shelton et al. |
| 7,118,970 | B2 | 10/2006 | Das et al. |
| 7,220,661 | B1 | 5/2007 | Yu et al. |
| 7,229,866 | B2 | 6/2007 | Zhu et al. |
| 7,235,330 | B1 | 6/2007 | Fujimoto et al. |
| 7,238,976 | B1 | 7/2007 | Yu et al. |
| 7,253,015 | B2 | 8/2007 | Pophristic et al. |
| 7,323,402 | B2 | 1/2008 | Chiola |
| 7,417,266 | B1 | 8/2008 | Li et al. |
| 7,547,928 | B2 | 6/2009 | Germain et al. |
| 7,638,818 | B2 | 12/2009 | Wu et al. |
| 7,696,540 | B2 | 4/2010 | Francis et al. |
| 7,696,598 | B2 | 4/2010 | Francis et al. |
| 7,863,172 | B2 | 1/2011 | Zhu et al. |
| 7,939,853 | B2 | 5/2011 | Murphy et al. |
| 8,026,568 | B2 | 9/2011 | Zhu et al. |
| 8,097,512 | B2 | 1/2012 | Li et al. |
| 8,169,003 | B2 | 5/2012 | Murphy et al. |
| 2001/0001494 | A1 | 5/2001 | Kocon |
| 2002/0015833 | A1 | 2/2002 | Takahashi et al. |
| 2003/0015708 | A1 | 1/2003 | Parikh et al. |
| 2003/0062525 | A1 | 4/2003 | Parikh et al. |
| 2003/0098462 | A1 | 5/2003 | Yoshida |
| 2004/0016965 | A1 | 1/2004 | Ui et al. |
| 2004/0021152 | A1 | 2/2004 | Nguyen et al. |
| 2004/0119063 | A1 | 6/2004 | Guo et al. |
| 2005/0087763 | A1 | 4/2005 | Kanda et al. |
| 2005/0179106 | A1 | 8/2005 | Asano et al. |
| 2005/0215012 | A1 | 9/2005 | Williams et al. |
| 2006/0108606 | A1 | 5/2006 | Saxler et al. |
| 2006/0151868 | A1 | 7/2006 | Zhu et al. |
| 2006/0186422 | A1 | 8/2006 | Gaska et al. |
| 2006/0244010 | A1 | 11/2006 | Saxler |
| 2007/0164321 | A1 * | 7/2007 | Sheppard et al. ............. 257/256 |
| 2007/0228415 | A1 | 10/2007 | Kanamura et al. |
| 2009/0191674 | A1 | 7/2009 | Germain et al. |

FOREIGN PATENT DOCUMENTS

| | | |
|---|---|---|
| EP | 0514018 | 11/1992 |
| EP | 1612866 | 1/2006 |
| EP | 1643561 | 4/2006 |
| FR | 2844099 | 3/2004 |
| JP | 11040847 | 2/1992 |
| JP | 08050922 | 2/1996 |
| JP | 09306504 | 11/1997 |
| JP | 11135115 | 5/1999 |
| JP | 11145514 | 5/1999 |
| JP | 2000216409 | 8/2000 |
| JP | 2000512075 | 9/2000 |
| JP | 2001357855 | 12/2001 |
| JP | 2002083594 | 3/2002 |
| JP | 2003506903 | 2/2003 |
| JP | 2004186558 | 7/2004 |
| JP | 2005209377 | 8/2005 |
| JP | 2005317843 | 11/2005 |
| JP | 2006155959 | 6/2006 |
| WO | 9641906 | 12/1996 |
| WO | 0131722 | 5/2001 |
| WO | 0143174 | 6/2001 |
| WO | 03032397 | 4/2003 |

OTHER PUBLICATIONS

Yoshida et al. "A New GaN Based Field Effect Schottky Barrier Diode with a Very Low On-Voltage Operation," Proceedings of 2004 Power Semiconductor Devices & ICs, Kitakyushu, May 24, 2004, pp. 323-326, XP010723404, ISBN: 978-4-88686-060-6.

Hashizume Tamotsu et al. "Chemisty and Electrical Properties of Surfaces of GaN and GaN/AlGaN Heterostructures," Journal of Vacuum Science and Technology: Part B, AVS/AIP, Melville, New York, NY, US, vol. 19, No. 4, Jul. 1, 2001, pp. 1675-1681, XP012008931.

* cited by examiner

US 8,633,094 B2

GAN HIGH VOLTAGE HFET WITH PASSIVATION PLUS GATE DIELECTRIC MULTILAYER STRUCTURE

TECHNICAL FIELD

The present invention relates generally to Nitride III-based compound semiconductor devices and methods of fabrication thereof; more specifically, to Gallium Nitride (GaN) switching devices including GaN high electron mobility transistors (HEMTs) and GaN Hetero-junction Field Effect transistors (HFETs) and to methods of fabricating such power transistor devices.

BACKGROUND

Gallium nitride (GaN) and other wide band-gap nitride III based direct transitional semiconductor materials are advantageously utilized in certain electronic devices due to their superior physical prosperities over silicon-based devices. For example, GaN and AlGaN/GaN transistors are commonly used in high-speed switching and high-power applications due to the high electron mobility, high breakdown voltage, and high saturation electron velocity characteristics offered by GaN-based materials and device structures.

GaN and AlGaN/GaN integrated circuit (IC) devices are typically prepared by epitaxial growth of a semi-insulating (highly-resistive) GaN buffer layer on a substrate material such as Sapphire, Silicon Carbide, single crystal GaN, Si and so on. For high voltage operations, the IC device is required to have a high breakdown voltage VBR with minimal leakage current through the GaN buffer layer. One source of leakage current is the unintentionally doping (UID) by residual donors such as oxygen in the GaN buffer layer. For example, oxygen may be unintentionally introduced into the GaN buffer layer as a result of surface contamination during frontend and backend fabrication processing steps. In addition, charge build-up (either positive or negative) may occur at the interfaces as a result of the piezoelectric nature of GaN and multiple dielectric depositions commonly performed during passivation. This charge build-up can adversely impact the voltage-current characteristics and frequency response of the IC device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
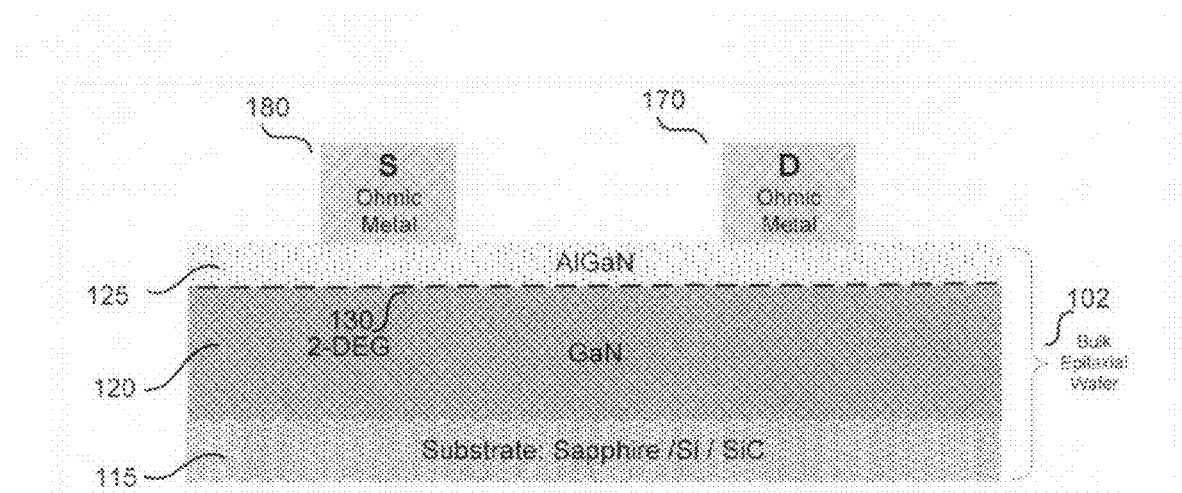
FIGS. 1A-1C are cross-sectional side views that illustrate an example GaN-based HFET device at various stages in a fabrication process, in accordance with embodiments of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a "wafer" is a thin slice of semiconductor material, such as a silicon, sapphire, silicon carbide, gallium nitride, etc., crystal, used in the fabrication of integrated circuits.

In accordance with embodiments of the present invention, a GaN-based transistor device and method of fabricating the same is disclosed which includes an in situ processing step to form a passivation plus gate dielectric (e.g., oxide) multilayer for an HFET. A new material combination based on aluminum nitride (AlN) and aluminum oxy-nitride (AlON) is advantageously utilized in a fabrication process flow that mitigates charge build-up during passivation. At the same time, a high quality gate oxy-nitride layer is produced for use in a high power GaN-based HEMT. In one embodiment, an Atomic Layer Deposition (ALD) reaction chamber technique is utilized to form a high-quality, thin layer of nitride compound (e.g., AlN) over active transistor device layers, immediately followed by a gate oxide deposition comprising an oxy-nitride (e.g., AlON) material layer.

Figure 1B:
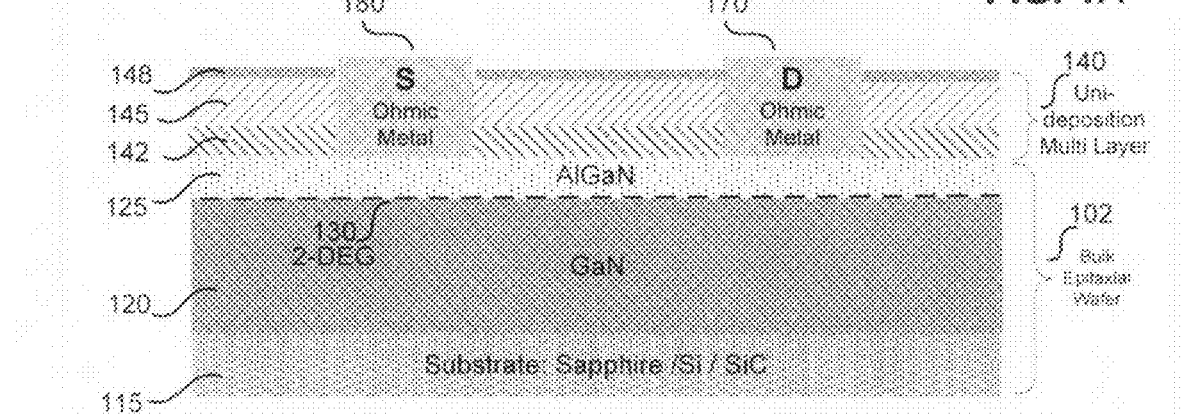
Figure 1C:
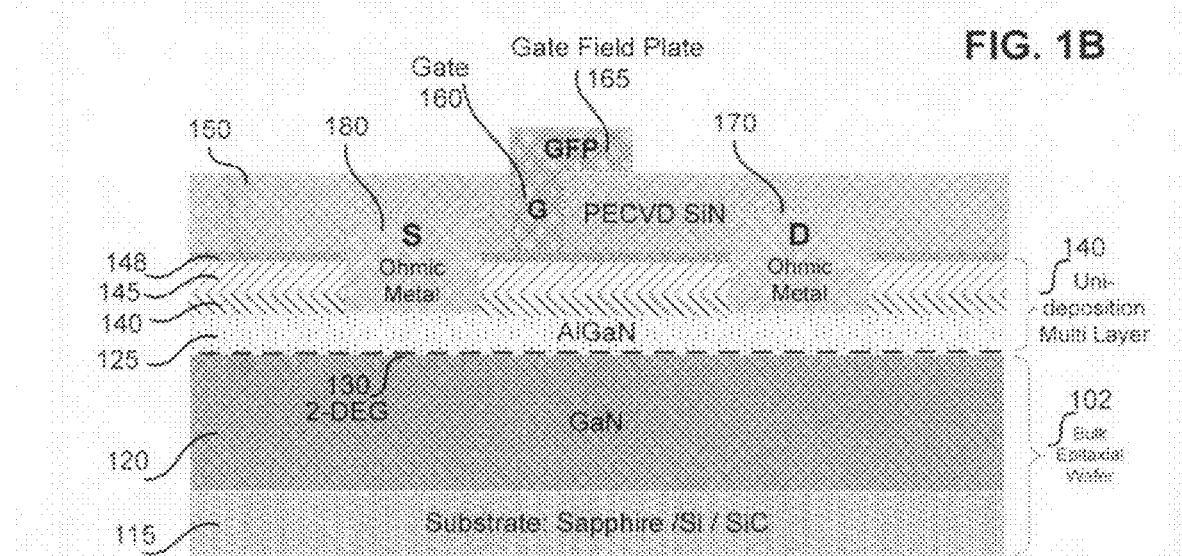

FIGS. 1A-1C illustrate cross-sectional side views of a semiconductor device structure (e.g., a GaN HFET device) at various stages in an example fabrication process. For example, FIG. 1A shows a bulk epitaxial wafer 102 which includes a substrate 115 formed of any one of a number of different materials, e.g., Sapphire, Si, GaN, or SiC. An epitaxial GaN buffer layer 120 is shown formed as the first active layer on substrate 115. To avoid possible problems with lattice mismatch and/or differences in thermal coefficients of expansion, an optional thin nucleation layer may be formed between substrate 115 and buffer layer 120 (see e.g., layer 215 in FIG. 2).

FIG. 1A further shows an Aluminum Gallium Nitride (AlGaN) layer 120 formed atop GaN buffer layer 120. AlGaN layer 120 comprises a second active layer of the GaN HFET device. A two dimensional electron gas channel (2-DEG) 130 is formed at the interface between AlGaN layer 120 and GaN buffer layer 120 due to the band-gap difference between the two material layers.

As shown, FIG. 1A also illustrates the device structure at a point in the fabrication process just after formation of ohmic metal contacts 180 and 170, which respectively comprise source and drain electrodes of the GaN HFET device. FIG. 1A shows ohmic metal contacts 180 and 170 formed directly on AlGaN layer 120. In other embodiments, ohmic metal contacts 180 and 170 may be formed in recesses that extend vertically downward through AlGaN layer 125 to contact GaN buffer layer 120.

FIG. 1B illustrates the example GaN HFET device structure of FIG. 1A after formation of a multi-layer structure 140 which comprises a passivation plus gate dielectric structure. In one embodiment, multi-layer structure 140 comprises an AlN layer 142 disposed directly on AlGaN layer 142, and an AlON layer 145 disposed directly on AlN layer 140. In other embodiments, passivation layer 142 may comprise SiN or other similar nitride-based materials. Gate dielectric layer 145 may also comprise silicon oxy-nitride (SiON) or another oxy-nitride material having similar properties.

FIG. 1B also shows an optional thin (e.g., 2-4 nm) second passivation layer 148 disposed directly on AlON layer 145. In the example shown, second passivation layer 148 comprises silicon nitride (SiN). It is appreciated that second passivation layer 148 may not be needed in certain embodiments. As shown, multilayer structure 140 functions both as a first or initial passivation layer to prevent surface oxidation/contamination of the underlying AlGaN (active) layer 125, and also a gate dielectric (insulator) for the completed GaN HFET device. In addition, AlN passivation layer 140 helps with the efficient modulation of charge, reduces leakage current, and increases the off-state voltage withstand of the completed GaN HFET device.

In one embodiment, multilayer structure 140 is formed in situ in an ALD reaction chamber with AlN layer 140 being formed with a thickness in a range of about 2-10 nm, and AlON layer 145 being formed with a thickness in a range of about 10-25 nm thick. In certain embodiments, AlON layer 145 may either be graded to allow for a smooth, gradual transition from the nitride to oxy-nitride layers (films). That is, the nitrogen composition in AlON layer 145 may vary from a highest atomic percentage (e.g., at or near 100%) at the interface with AlN layer 140 to a lowest percentage (e.g., a few atomic percent) at or near the top surface of AlON layer 145.

FIG. 1C illustrates the device structure of FIG. 1B after formation of a gate member 160, gate field plate 165, and Plasma Enhanced Chemical Vapor Deposition (PECVD) second passivation layer 170, the latter of which, in the example shown, comprises SiN. Persons of ordinary skill in the semiconductor arts will understand that FIG. 1C illustrates a completely fabricated GaN HFET device. It is further appreciated that other standard post-fabrication or back-end processing steps may be performed, including forming metal (e.g., patterned lines or traces) on the surface of the wafer, wafer backgrinding (also called backlapping or wafer thinning), die separation, and packaging.

Figure 2:
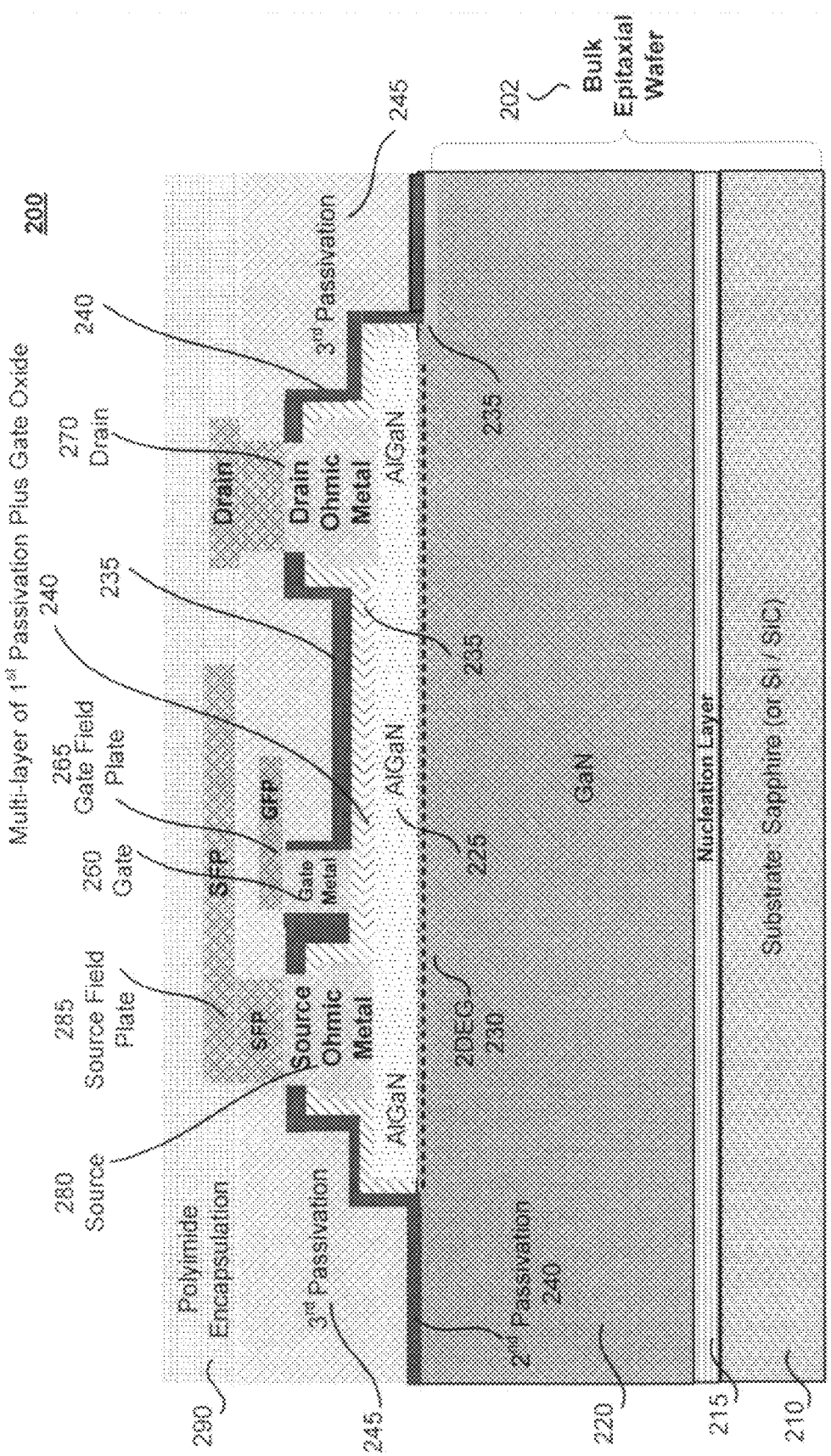
FIG. 2 is a cross-sectional side view of another example GaN HFET with embodiments of the present invention shown in FIGS. 1A-1C after completion of the fabrication process.

FIG. 2 is a cross-sectional side view of another completely fabricated GaN HFET device 200 that includes multilayer structure 240 comprising a combined first passivation and gate dielectric as described above. In the example shown, GaN HFET device 200 includes a nucleation (transitional) layer 215 disposed atop a substrate 210. Substrate 210 may comprise, without limitation, materials such as sapphire, silicon, gallium nitride, or silicon carbide (SiC). In one embodiment, nucleation layer 215 comprises an aluminum rich layer of AlGaN ($Al_xGa_{(x-1)}N$; $0 > x > 1$). Substrate 210, nucleation layer 215, and GaN buffer layer 220 collectively comprise bulk epitaxial wafer 202.

Continuing with the example device structure of GaN HFET 200, a GaN buffer layer 220 is disposed atop nucleation layer 215, and an AlGaN (or more generally, $Al_xGa_{(x-1)}N$; $0 > x > 1$) layer 225 is disposed atop GaN buffer layer 220. GaN HFET device 200 further includes a multi-layer (e.g., passivation plus gate dielectric) structure 235, second passivation layer 240, third passivation layer 245, and polyimide encapsulation layer 290. Source and drain ohmic metal contacts 280 and 270 are respectively formed directly on (or alternatively in recesses of) AlGaN layer 225. A gate member 260 is disposed atop of multi-layer structure 240. GaN HFET device 200 is also shown including a gate field plate 265 and a source field plate 285.

Figure 3:
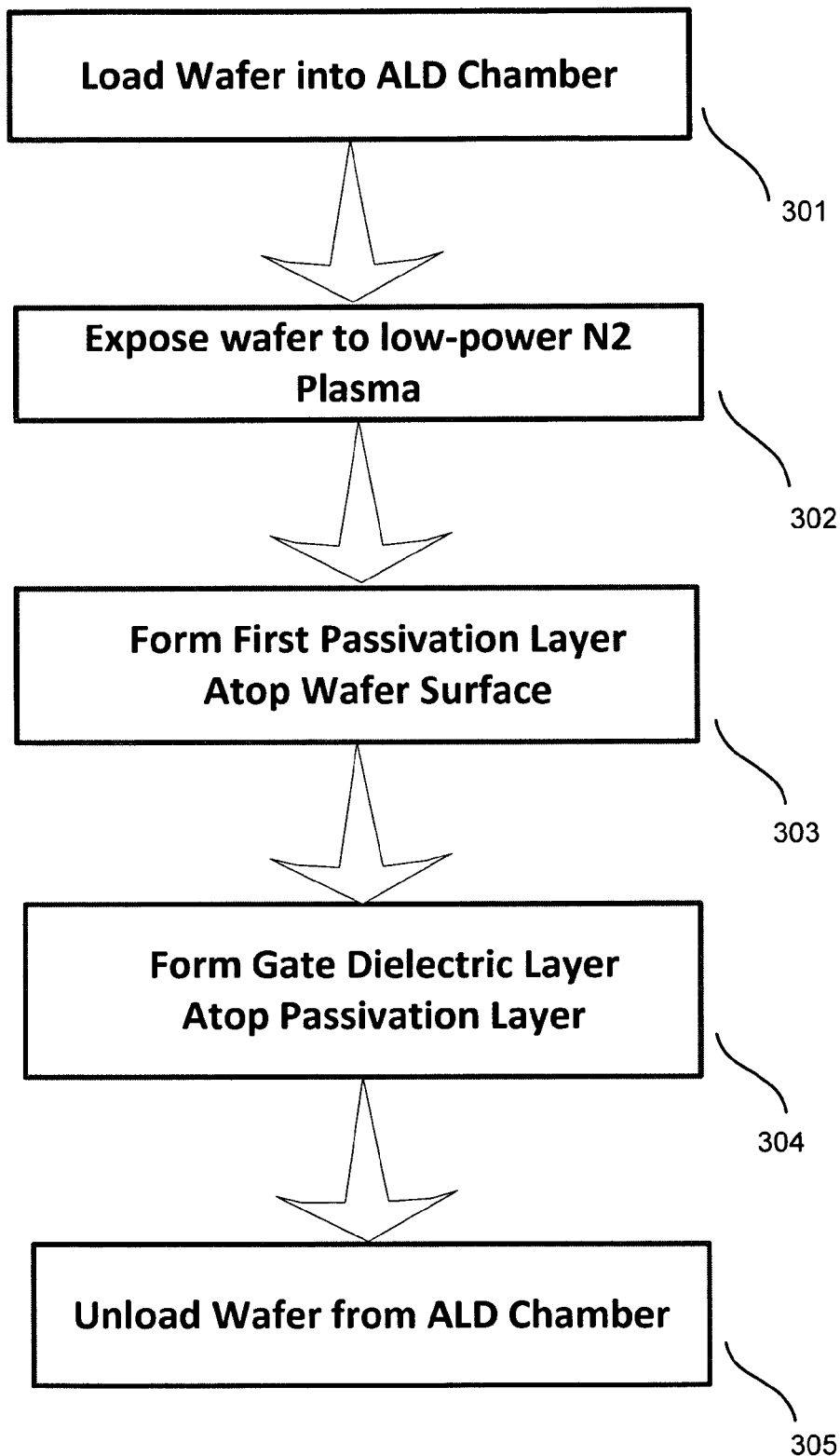
FIG. 3 is an example sequence of steps for formation of a passivation plus gate dielectric/insulation multilayer structure.

FIG. 3 is an example sequence of steps for formation of a first passivation plus gate dielectric multilayer structure. Following formation of ohmic metal contacts to the source and drain regions of the HFET, the multi-layer structure formation process begins with the immediate loading of the wafer into an ALD reaction chamber (block 301). Extended exposure to ambient atmosphere should be minimized to prevent oxidation of the top surface (i.e., active layer) of the wafer, which could result in the formation of an unwanted $Ga_2O_3$ layer. In one embodiment, after the wafer has been loaded into chamber, it remains under vacuum for about 3 minutes, with the temperature being stabilized at around 300 C.

Once loaded into the ALD reaction chamber, the top surface of the wafer (e.g., AlGaN layer 125 in FIG. 1) is exposed to a nitrogen ($N_2$) plasma strike, typically performed at low power (block 302). This plasma exposure acts as a cleaning step to prepare the surface of the wafer material for the subsequent ALD deposition steps.

Next, the first (e.g., AlN) passivation layer is formed in repetitive cycles of a sequence of steps (block 303). The typical time duration of each cycle may take anywhere from about 20 ms to about 20 seconds, which results in the formation of a layer (film) of between 0.1 Å-3.0 Å thick. In one embodiment, the sequence begins with exposure of the wafer to an aluminum source, e.g., tri-methyl aluminum (TMA), for about 30 milliseconds. This allows aluminum to react with the top surface (e.g., AlGaN) of the wafer. Following exposure to the aluminum source, the chamber and lines are purged of aluminum by an argon gas flush for approximately 2 seconds.

After the chamber and lines have been purged of aluminum, a nitrogen plasma strike is performed for about 15 seconds. This step provides a source of nitrogen to react with the aluminum previously deposited on the surface of wafer. In other words, a surface reaction occurs resulting in the formation of an AlN passivation layer. As previously discussed, in alternative embodiment, a SiN passivation layer may also be formed using silicon as a source rather than aluminum. Following the $N_2$ plasma strike, the chamber and lines are again purged (e.g., Argon gas for about 3 seconds), after which time the cycle may be repeated to achieve the desired material layer thickness. For the example GaN HFET device described above, the thickness of the AlN passivation layer is in an approximate range of 2-10 nm thick.

A second sequence of repetitive cycles is then performed to form a gate dielectric (e.g., oxide) layer atop the first AlN passivation layer (block 304). Note that the wafer is not removed from the ALD reaction chamber after any of the preceding steps. That is, the formation of the passivation plus gate dielectric multilayer structure is accomplished in situ, i.e., with the wafer in the ALD reaction chamber for the entirety of the processing steps required for formation of the multi-layer structure.

In one embodiment, the second sequence begins with exposure to an aluminum source (TMA) with a specific dose which results in the reaction of aluminum on the AlN surface. The ALD reaction chamber and lines are then purged by an Argon gas flush for about 2 seconds. Next, a nitrogen-oxygen plasma strike is performed for about 15 seconds to provide a dual source of nitrogen and oxygen to react with the aluminum previously deposited on the surface of wafer. This step results in the formation of an atomic smooth layer of AlON atop the underlying AlN passivation layer. A second purge of the chamber and lines is performed again using Argon gas for about 3 seconds to flush out any excess of nitrogen and oxygen. The above sequence of steps may be repeated as necessary to produce the desired layer (film) thickness. In one embodiment, an AlON gate dielectric layer is formed to a thickness of about 10-25 nm.

Following formation of the AlON layer, an optional SiN layer (e.g., 2-4 nm thick) may be formed atop the AlON layer while the wafer remains in the ALD reaction chamber. The wafer is then removed from the ALD reaction chamber (block 305) and then subjected to the remaining processing steps necessary to completely fabricate the GaN HFET device. It is appreciated that the total processing time in the ALD reaction chamber is a function of the desired total thicknesses of the passivation and gate dielectric layers which form the multi-layer structure.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example thicknesses, material types, processing steps, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. A method of fabricating a multi-layer structure for a power transistor device comprising:
   (a) loading a wafer having a nitride-based active semiconductor layer into a reaction chamber;
   (b) exposing, within the reaction chamber, a top surface of the nitride-based active semiconductor layer to a first source;
   (c) performing, within the reaction chamber, a nitrogen (N) plasma strike, resulting in the formation of a nitride layer directly on the nitride-based active semiconductor layer;
   (d) exposing, within the reaction chamber, a top surface of the nitride layer to a second source; and
   (e) performing, within the reaction chamber, a nitrogen-oxygen plasma strike, resulting in the formation of an oxy-nitride layer directly on the nitride layer, wherein the nitride layer comprises a passivation layer and the oxy-nitride layer comprises a gate dielectric of the power transistor device.

2. The method of claim 1 wherein the first source comprises aluminum (Al) and the nitride layer comprises an AlN layer.

3. The method of claim 1 wherein the first source comprises silicon (Si) and the nitride layer comprises a SiN layer.

4. The method of claim 1 wherein the first source comprises a tri-methyl aluminum (TMA) source.

5. The method of claim 1 wherein the second source comprises aluminum (Al) and the oxy-nitride layer comprises an AlON layer.

6. The method of claim 1 wherein the second source comprises a tri-methyl aluminum (TMA) source.

7. The method of claim 1 further comprising repeating steps (b) and (c) until the nitride layer is formed to a first thickness.

8. The method of claim 7 wherein the first thickness is in a range of about 2-10 nm thick.

9. The method of claim 1 further comprising repeating steps (d) and (e) until the oxy-nitride layer is formed to a second thickness.

10. The method of claim 9 wherein the second thickness is in a range of about 10-25 nm thick.

11. The method of claim 1 further comprising removing the wafer from the reaction chamber.

12. The method of claim 1 further comprising:
    forming, within the reaction chamber, a silicon nitride layer atop the oxy-nitride layer; and
    removing the wafer from the reaction chamber.

13. The method of claim 1 wherein the oxy-nitride layer is formed with a graded nitrogen composition that varies from a highest atomic percentage at or near the nitride layer to a lowest atomic percentage at or near a top surface of the oxy-nitride layer.

14. The method of claim 1 wherein the nitride-based semiconductor layer comprises AlGaN.

15. A method of fabricating a multi-layer structure for a hetero-junction field-effect transistor (HFET) device comprising:
    (a) exposing, within the reaction chamber, a top surface of a nitride-based semiconductor layer to a first aluminum source;
    (b) exposing, within the reaction chamber, the wafer to a nitrogen (N) plasma, resulting in the formation of an aluminum nitride (AlN) layer atop the nitride-based semiconductor layer;
    (c) exposing, within the reaction chamber, a top surface of the AlN layer to a second aluminum source; and
    (d) exposing, within the reaction chamber, the wafer to a nitrogen-oxygen plasma, resulting in the formation of an aluminum oxy-nitride (AlON) layer atop the AlN layer, wherein the nitride layer comprises a passivation layer and the oxy-nitride layer comprises a gate dielectric of the hetero-junction field-effect transistor (HFET) device.

16. The method of claim 15 wherein the first aluminum source and the second aluminum source both comprise a tri-methyl aluminum (TMA) source.

17. The method of claim 15 further comprising repeating steps (a) and (b) until the AlN layer is formed to a first thickness.

18. The method of claim 17 wherein the first thickness is in a range of about 2-10 nm thick.

19. The method of claim 15 further comprising repeating steps (c) and (d) until the AlON layer is formed to a second thickness.

20. The method of claim 19 wherein the second thickness is in a range of about 10-25 nm thick.

21. The method of claim 15 further comprising forming, within the reaction chamber, a silicon nitride layer atop the AlON layer.

22. The method of claim 15 wherein the AlON layer is formed with a graded nitrogen composition that varies from a highest atomic percentage at or near the nitride layer to a lowest atomic percentage at or near a top surface of the oxy-nitride layer.

23. The method of claim 15 wherein the nitride-based semiconductor layer comprises AlGaN.

* * * * *